United States Patent
Peron

(10) Patent No.: US 7,236,383 B2
(45) Date of Patent: Jun. 26, 2007

(54) DETECTION OF THE ZERO CROSSING OF AN A.C. VOLTAGE

(75) Inventor: Benoît Peron, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/254,020

(22) Filed: Oct. 19, 2005

(65) Prior Publication Data

US 2006/0082349 A1    Apr. 20, 2006

(30) Foreign Application Priority Data

Oct. 19, 2004    (FR)    .................................. 04 52372

(51) Int. Cl.
*H02M 7/00* (2006.01)
(52) U.S. Cl. ...................................... 363/125
(58) Field of Classification Search ................. 363/52, 363/53, 54, 81, 84, 89, 125, 126, 127
See application file for complete search history.

(56) References Cited

U.S. PATENT DOCUMENTS

| | | | |
|---|---|---|---|
| 4,086,466 A | 4/1978 | Scharlack | |
| 5,420,780 A * | 5/1995 | Bernstein et al. | 363/89 |
| 5,841,641 A * | 11/1998 | Faulk | 363/21.14 |
| 5,936,495 A | 8/1999 | LeCourt | |
| 5,936,854 A * | 8/1999 | Uesugi et al. | 363/44 |
| 6,222,749 B1 * | 4/2001 | Peron | 363/125 |
| 6,577,517 B2 * | 6/2003 | Jain et al. | 363/89 |
| 6,756,711 B2 * | 6/2004 | Ball et al. | 323/222 |

OTHER PUBLICATIONS

French Search Report from corresponding French Application No. 0452372, filed Oct. 19, 2004.

* cited by examiner

*Primary Examiner*—Adolf Berhane
(74) *Attorney, Agent, or Firm*—Lisa K. Jorgenson; James H. Morris; Wolf, Greenfield & Sacks, P.C.

(57) ABSTRACT

A circuit for detecting the zero crossing of a variable voltage across at least one switching element, including circuitry for measuring the slope of the voltage when it varies in a given direction, and for indicating a zero crossing if this slope is comprised within a range of values.

11 Claims, 6 Drawing Sheets

DETECTION OF THE ZERO CROSSING OF AN A.C. VOLTAGE

BACKGROUND OF THE INVENTION

1. Field of the Invention

The present invention generally relates to the detection of a zero crossing of a variable voltage and, more specifically, to the detection of the zero crossings of an A.C. voltage of known frequency.

The present invention, for example, applies to systems for detecting zero crossing of the mains voltage for controlling the operation of power converters, and especially of converters using (for example, as a controllable rectifying element) one or several power switches of thyristor, IGBT, etc. type.

The present invention more specifically applies to the case where the triggering of the power converter is desired to be controlled in the vicinity of a zero crossing to limit the surge current, without using a resistor having a high value.

2. Discussion of the Related Art

A recurrent problem of systems for detecting the zero crossing of an A.C. voltage provided by the mains is to avoid wrong detections due to microfailures making the mains voltage transiently disappear, or to bounces linked to the use of a mechanical switch on circuit powering-on.

FIG. 1 is a schematic block diagram of an exemplary power converter connected to the electric distribution network, of the type to which the present invention applies. For example, it may be a converter of switched-mode power supply type. The power converter is symbolized by a block 1 (PWC) in charge of supplying a load (not shown) with a voltage Vout. Generally, such a converter regulates voltage Vout on a predetermined reference value.

Converter 1 receives a D.C. voltage sampled across a filtering capacitor Cf connecting rectified output terminals 2 and 3 of a controllable bridge 4 having its A.C. inputs 5 and 6 receiving mains supply voltage Vac. In practice, a switch 7, generally a mechanical switch, is interposed between a first terminal 8 of application of voltage Vac and a first terminal 5 of bridge 4. Second A.C. input 6 of bridge 4 is connected to the second terminal 9 of application of voltage Vac. A mains filter (not shown) is further interposed between terminals 8 and 9 of application of voltage Vac and bridge 4.

In the example of FIG. 1, bridge 4 is a controllable bridge comprised of two thyristors Th1 and Th2 and two diodes D1 and D2. For example, thyristor Th1 is in series with diode D1 between terminals 3 and 2, the interconnection point corresponding to A.C. input terminal 5. Thyristor Th2 is in series with diode D2 between terminals 3 and 2, with terminal 6 as an interconnection point. Thyristors Th1 and Th2 are, in this example, cathode-gate thyristors and are controlled by a circuit 10 detecting the zero crossings (ZVS) of the voltage thereacross.

Other configurations are possible. In particular, the respective positions of the thyristors and of the diodes may be inverted. Similarly, additional switches, controlled according to the zero crossings of the A.C. voltage may be interposed at other circuit locations.

The function of circuit 10 for detecting the zero crossings is to turn on thyristors Th1 and Th2 each, at least at the starting, in the vicinity of the zero crossing of A.C. voltage Vac to avoid a turning-on of controlled bridge 4 in the middle of a halfwave, that is, under a high voltage. More generally, such a detection of the zero voltage relates to the zero crossings of the voltage between terminals of circuit 10, in practice across different elements of the converter. In the case of FIG. 1, this detection is performed across the actual power switches, circuit 10 providing control signals to the gates of thyristors Th1 and Th2.

FIG. 2 shows a conventional example of a circuit 10 for detecting the zero crossings of an A.C. voltage of the type illustrated in FIG. 1. In FIG. 2, the thyristors controlled by circuit 10 have also been shown, but for the fact that they are here assumed to be in the high stage of the rectifying bridge, that is, at the respective locations of diodes D1 and D2, which illustrates an alternative assembly with respect to FIG. 1.

In the representation of FIG. 2, thyristors Th1 and Th2 have their respective anodes connected to terminals 5 and 6 and their cathodes connected to terminal 2. The low portion of the bridge, formed, for example, of diodes, has not been illustrated. The assembly comprises a detection element for detecting the voltage difference between terminals 5 and 6 and a control element for controlling switches Th1 and Th2.

The respective gates of thyristors Th1 and Th2 are connected to the junction point of a MOS power transistor M and of a resistor R2. The gate of transistor M is connected to terminal 2 by a capacitor C and to the anode of an auxiliary thyristor Th3, triggered by the element for detecting the zero crossing of the voltage at terminals 5 and 6. This detection element comprises two diodes D3 and D4 having their respective anodes connected to terminals 5 and 6 and having their cathodes interconnected at a node A of the assembly. A dividing bridge, formed of resistors R3 and R4 in series, connects points A and terminal 2. The junction point is connected to the gate of thyristor Th3. In practice, a zener diode DZ2 is interposed between this gate and resistor R3 to set a control threshold. Capacitor C (anode of thyristor Th3) is connected to terminal A by a resistor R1 and a diode D7 connects this terminal A to the source of transistor M having its drain connected to resistor R2. Transistor M ensures an impedance matching between capacitor C and resistor R2 and a control of the current in resistor R2 according to the voltage across capacitor C. A diode D is connected in parallel on capacitor C.

The values of resistors R1, R2, R3, and R4 are selected so that the voltage across capacitor C is greater than the voltage across resistor R3, independently from the voltage difference between terminals 2 and A.

The function of capacitor C is to damp the abrupt variations of the supply voltage to avoid, due to thyristor Th3, the turning-on of one of thyristors Th1 or Th2. Thyristor Th3, when on, prevents the triggering of a thyristor Th1 or Th2 since it discharges capacitor C, preventing the turning-on of transistor M.

A circuit for limiting the surge current and controlling power switches of a rectifying bridge such as illustrated in FIG. 2 is described in U.S. Pat. No. 6,222,749, which is incorporated herein by reference.

A disadvantage of this solution is that it is difficult to integrate due to the large number of analog components used.

Another disadvantage is the use of a high-voltage MOS transistor (M).

SUMMARY OF THE INVENTION

The present invention aims at providing a detector of the zero crossings of an A.C. voltage which overcomes some of the disadvantages of known techniques. The present invention also aims at providing a solution which is compatible with a detection of microfailures and with the use of a switch (for example, mechanical) generating bounces.

The present invention also aims at providing a solution which is easily integrable.

The present invention also aims at avoiding use of a high-voltage switch in the detection circuit.

The present invention also aims at providing a circuit compatible with a limitation of the surge current in a capacitor placed downstream of a rectifying bridge.

The present invention further aims at preserving the taking into account of the zero voltage, with respect to the A.C. supply voltage in a transient state, and with respect to the difference between the voltage of the capacitor downstream of the rectifying bridge and this supply voltage in steady state.

To achieve all or part of these objects, as well as others, the present invention provides a circuit for detecting the zero crossing of a variable voltage across at least one switching element, comprising means for measuring the slope of said voltage when it varies in a given direction, and for indicating a zero crossing if this slope is comprised within a range of values.

According to an embodiment of the present invention, a measurement of the slope is initialized by the passing under at least one value by a decrease in said voltage.

According to an embodiment of the present invention, said means comprise:

first means of hysteresis comparison of the voltage across the switching element with two first respectively high and low values according to whether the voltage increases or decreases;

second means for comparing the voltage across the switching element with a second value ranging between the first two thresholds;

third means for comparing the voltage across the switching element with a third value smaller than the first low value; and a logic analysis element having an output providing the zero crossing detection result.

According to an embodiment of the present invention, the logic analysis element comprises:

first controllable means of XOR-type combination of the results of the first two comparison means;

second controllable means of XOR-type combination of the results of the last two comparison means; and two delay means of fixed time constants, triggered either by the respective crossings of the second and third values by a decrease in the voltage either by an edge in a given direction of the second and third comparison means, respectively, and for respectively controlling the first and second combination means, the result of the detection being provided by the output of the first combination means.

According to an embodiment of the present invention, the first delay means are reset by an active output of the second combination means; and the second delay means are reset by an active output of the first combination means.

According to an embodiment of the present invention, the combination and delay means are formed of flip-flops.

The present invention also provides a method for detecting the zero crossing of a variable voltage across at least one switching element, comprising measuring the slope of said voltage when it varies in a given direction, and of indicating a zero crossing if this slope is comprised within a range of values.

The foregoing and other objects, features, and advantages of the present invention will be discussed in detail in the following non-limiting description of specific embodiments in connection with the accompanying drawings.

DETAILED DESCRIPTION

Figure 1:
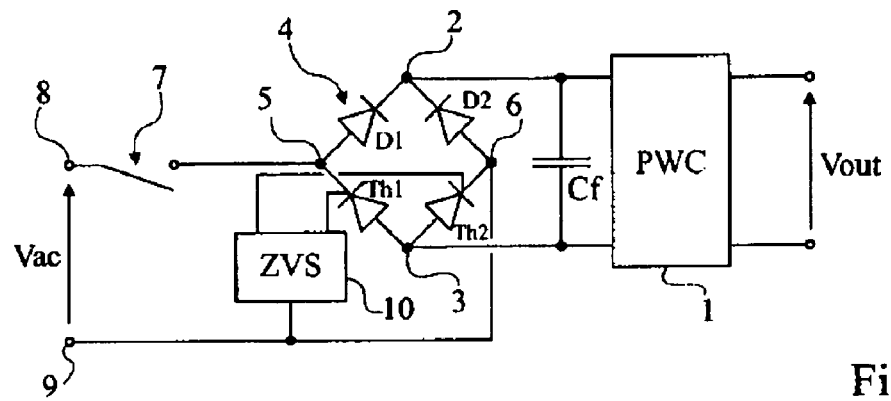
FIGS. 1 and 2, previously described, are intended to show the state of the art and the problem to solve.
Figure 2:
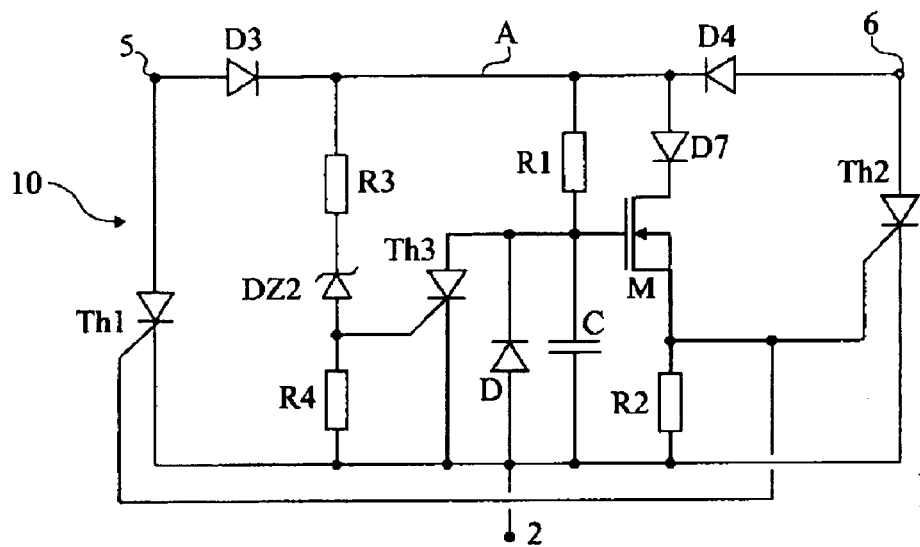

The same elements have been referred to with the same reference numerals in the different drawings. For clarity, only those elements that are necessary to the understanding of the present invention have been shown in the drawings and will be described hereafter. In particular, what exploitation is made of the detection of the zero crossings by means of a digital detector of the present invention has not been described in detail, the implementation of the present invention being compatible with the conventional exploitation of such detection signals.

A feature of an embodiment the present invention is to provide a detection of the zero crossings of the A.C. voltage to be supervised by means of digital elements, that is, by detecting the amplitude of the voltage with respect to predetermined thresholds, exploited by comparators with outputs in all or nothing, having their results exploited by elements of flip-flop type.

Advantage is taken from the fact that, when zero crossings of an A.C. voltage are desired to be detected especially to limit the surge current in a capacitor placed downstream of a rectifying bridge, the A.C. supply frequency is known. In other words, be it the starting or the steady state in which the voltage across the capacitor is supervised with respect to the A.C. voltage, the average period is always linked to the frequency of the A.C. power supply, which is approximately constant (for example, provided by the electric distribution mains).

Figure 3:
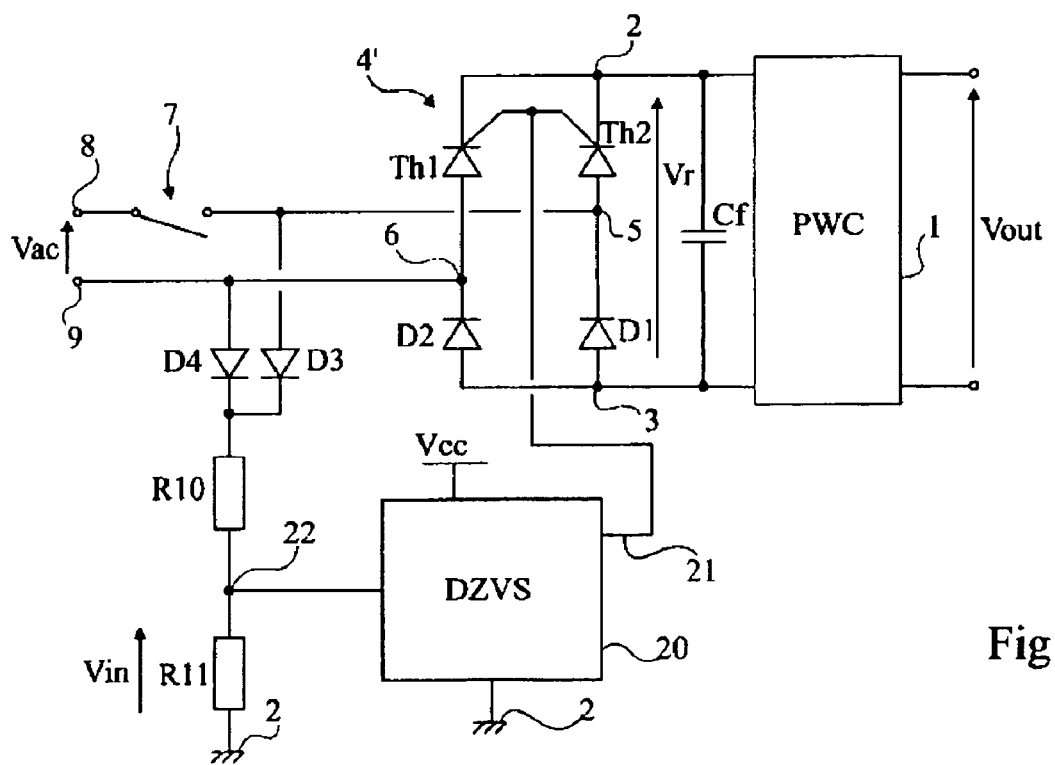
FIG. 3 very schematically illustrates in the form of blocks the assembly of a circuit for detecting the zero voltage to control a composite bridge according to an embodiment of the present invention.

FIG. 3 very schematically shows in the form of blocks a rectifying bridge 4' controllable by means of a zero voltage detection circuit 20 (DZVS) according to an embodiment of the present invention. Conventionally, a bridge 4' provides a rectified voltage Vr to a capacitor Cf for a circuit 1 (PWC) forming a power converter. Bridge 4' is, in the example of FIG. 3, formed of two diodes D1 and D2 and of two cathode-gate thyristors Th1 and Th2. Bridge 4' is supplied with an A.C. voltage Vac originating, for example, from the mains and which is applied between two input terminals 8 and 9. Terminal 8 is connected, via a switch 7 (for example, mechanical) to a first A.C. input terminal 5 of bridge 4' corresponding, for example, to the anode of thyristor Th1 and to the cathode of diode D1. A second A.C. input 6 of bridge 4' is directly connected to a second terminal 9 of application of voltage Vac and corresponds, for example, to the anode of thyristor Th2 and to the cathode of diode D2. Rectified output voltage Vr of bridge 4' is sampled between common cathodes 2 of thyristors Th1 and Th2 and common anodes 3 of diodes D1 and D2. As compared with the conventional diagram of FIG. 1, the respective positions of the diodes and of the thyristors are inverted in bridge 4'. This has however no effect upon the operation of the present invention. Finally, a mains filter is generally provided between terminals 8 and 9.

The respective gates of thyristors Th1 and Th2 are connected to a terminal 21 of zero crossing detection circuit 20. A second terminal 22 of this circuit 20 is connected to the midpoint of a, for example, resistive dividing bridge. The function of this bridge is to sample information representative of the input voltage of bridge 4' (in practice Vac). For this purpose, two diodes D3 and D4 have their respective anodes connected to terminals 5 and 6 and their common cathodes connected to a first resistor R10 in series with a second resistor R11 connected to ground. An input of circuit 20 is connected to junction point 22 of resistors R10 and R11, providing a voltage Vin proportional to the absolute value of the input voltage of the bridge. Diodes D3 and D4 form an auxiliary halfwave rectifying bridge. Finally, circuit 20 receives a low D.C. supply voltage Vcc originating, for example, from an auxiliary winding of power converter 1 or any other conventional means for providing a low supply voltage Vcc. In the example of FIG. 3, the ground of circuit 20 corresponds to terminal 2 of the bridge.

Since the ground of detector 20 is taken from the positive electrode of capacitor Cf (terminal 2), it actually measures the difference between the absolute value of the input voltage of the rectifying bridge and the voltage across capacitor Cf, and thus more generally, the voltage across switching element Th1 or Th2, the zero crossings of which are desired to be detected.

Figure 4:
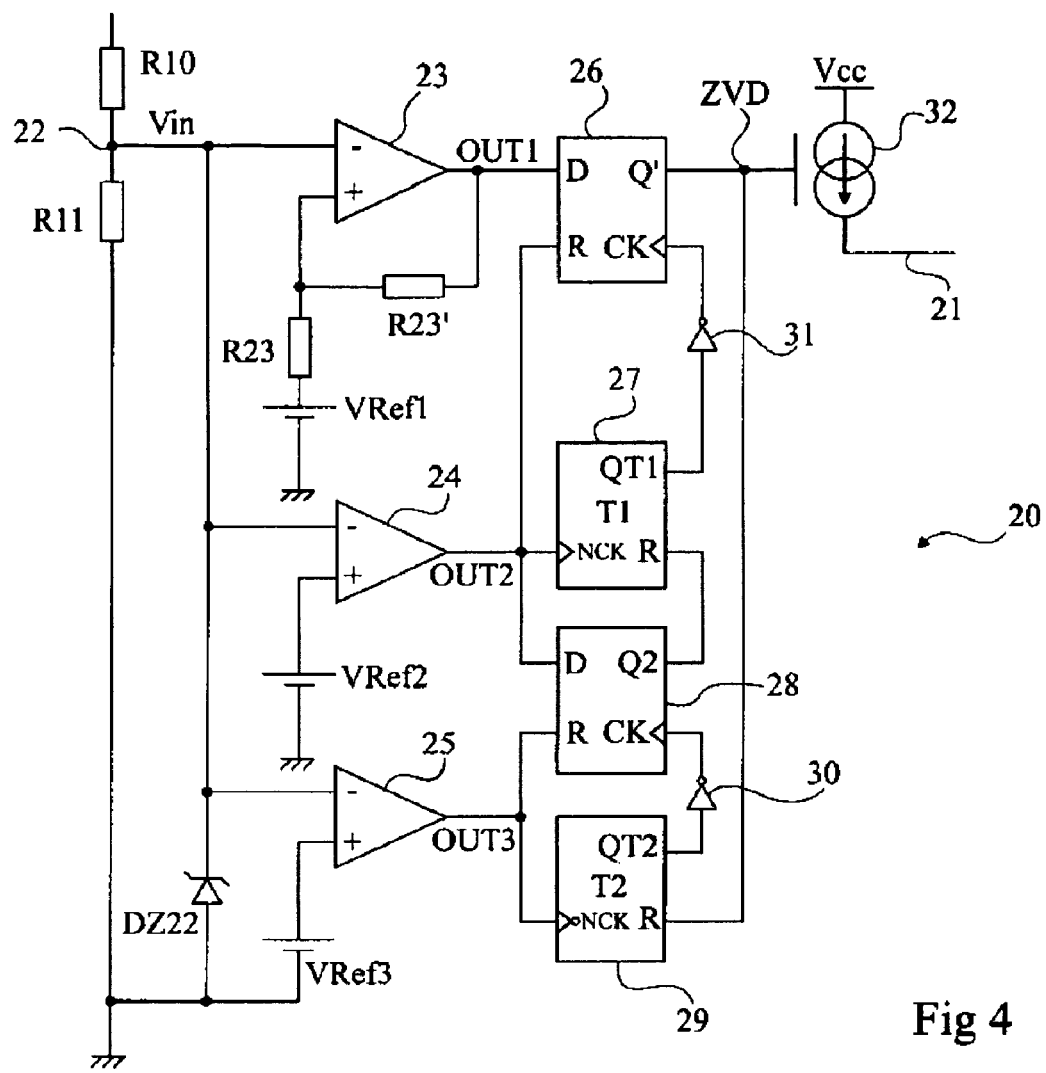
FIG. 4 shows an embodiment of a circuit for detecting the zero crossings of an A.C. voltage according to the present invention.

FIG. 4 shows a more detailed diagram of a detector 20 according to an embodiment of the present invention. This detector is formed of three comparators 23, 24, and 25 and of four flip-flops 26, 27, 28, and 29. All comparators receive, on a first input (for example, inverting), voltage Vin. A zener diode DZ22, having its anode connected to ground and having its cathode connected to terminal 22, protects the respective inputs of the comparators by clipping this voltage Vin. The threshold voltage of diode DZ22 is selected according to the maximum voltages that comparators 23 to 25 can stand. This threshold voltage also conditions the respective values of input resistors R10 and R11 with respect to the value of voltage Vac.

The respective second inputs (for example, non-inverting) of comparators 23 to 25 receive voltage references Vref1, Vref2, and Vref3. Comparator 23 is a hysteresis comparator having its two switching thresholds VHL and VHH conditioned, for example, by the value of voltage Vref1 and of two resistors R23 and R23' respectively connecting voltage source Vref1 to the non-inverting input and output OUT1 of comparator 23 to this non-inverting input. As will be seen hereafter, reference voltages Vref1, Vref2, and Vref3 are selected for voltage Vref2 to be greater than voltage Vref3 and for thresholds VHL and VHH of comparator 23 to surround value Vref2.

Output OUT1 of comparator 23 is connected to data input D of first flip-flop 26. Output OUT2 of comparator 24 is connected to reset input R of first flip-flop 26, to an inverted clock input NCK of second flip-flop 27 setting a first delay time T1, and to data input D of third flip-flop 28. Output OUT3 of comparator 25 is connected to reset input R of flip-flop 28 and to inverted clock input NCK of fourth flip-flop 29 setting a second delay time T2. Output QT2 of flip-flop 29 is connected, by an inverter 30, to clock input CK of flip-flop 28. Output Q2 of flip-flop 28 is connected to reset input R of flip-flop 27. Output QT1 of flip-flop 27 is connected by an inverter 31 to clock input CK of flip-flop 26. Output Q1 of flip-flop 26 provides a zero voltage detection signal ZVD and is connected to reset input R of flip-flop 29. In practice, output Q1 controls a current source 32 supplied by voltage Vcc and having its output forming terminal 21 of circuit 20 (FIG. 3) connected to the respective gates of thyristors Th1 and Th2.

Figure 5:
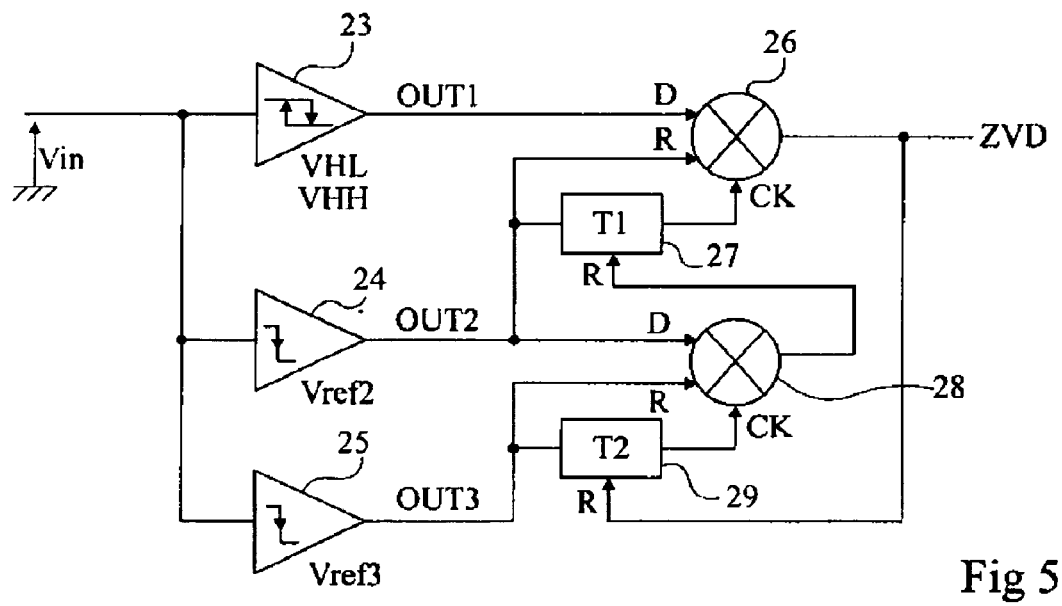
FIG. 5 is a functional representation of the circuit of FIG. 4.

Functionally, the circuit of FIG. 4 amounts to an assembly such as illustrated in FIG. 5 in which only the respective functions of the different elements have been illustrated. Comparators 23, 24, and 25 of input voltage Vin with respect to respective thresholds VHL, VHH, Vref2 and Vref3 are present. The function of flip-flop 26 is to perform a logic XOR combination between the respective outputs OUT1 and OUT2, the result being read under control of delay element 27 of duration T1 activated by the low switching of output OUT2. Flip-flop 28 amounts to a logic XOR combination between respective outputs OUT2 and OUT3, the result being read under control of delay 29 of duration T2 activated by the low switching of signal OUT3. Delay circuits 27 and 29 are reset either by the respective outputs of gates 28 and 26, or internally as soon as a falling edge is present on their respective clock inputs NCK.

Figure 6:
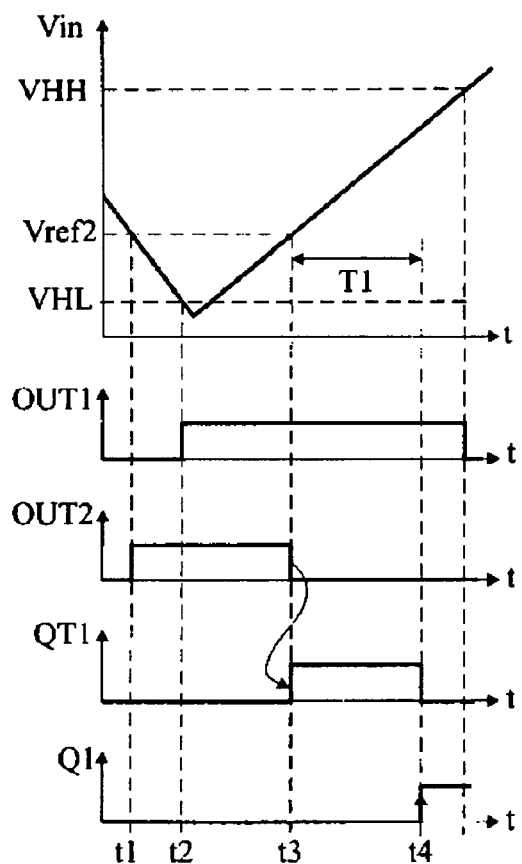
FIGS. 6 and 7 illustrate an example of selection of the voltage thresholds of a detector according to an embodiment of the present invention.
Figure 7:
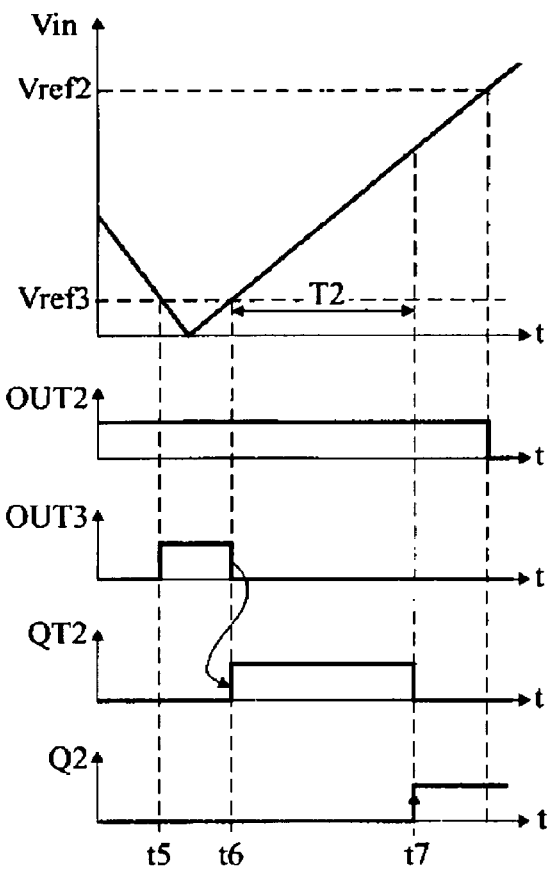

FIGS. 6 and 7 illustrate, in simplified timing diagrams, an example of the operation of a zero voltage detector according to an embodiment of the present invention.

FIG. 6 shows an example of the shape of signals Vin, OUT1, OUT2, QT1, and Q1 illustrating the operation of comparators 23 and 24 together.

As indicated previously, threshold voltage Vref2 is selected to be surrounded by thresholds VHH and VHL. When voltage Vin decreases, output OUT2 of comparator 24 switches high at a time t1 when voltage Vin becomes smaller than threshold Vref2. As a subsequent time t2 when voltage Vin becomes smaller than threshold VHL, output OUT1 of comparator 23 switches high.

When voltage Vin rises back, the crossing of threshold VHL has no effect due to the hysteresis of comparator 23. However, at a time t3 when voltage Vin becomes greater than threshold Vref2, output OUT2 of comparator 24 switches low, which causes the switching to the high state of output QT1 of flip-flop 27 and the starting of the delay of duration T1. At the end of delay T1 (time t4), output QT2 switches low, causing the reading of the logic combination performed by flip-flop 26, and thus the switching to the high state of output Q1 of flip-flop 26 (signal ZVD). This, provided that output OUT1 of comparator 23 still is in the high state, that is, threshold VHH has not been reached yet.

The hysteresis on first comparator 23 enables managing the bounces of voltage Vin, especially on circuit power-on.

FIG. 7 shows an example of the shape of signals Vin, OUT2, OUT3, QT2, and Q2 illustrating the operation of comparators 24 and 25 together.

When voltage Vin decreases down to voltage Vref3 (time t5), output OUT3 of comparator 25 switches high. Since threshold Vref3 is smaller than threshold Vref2, output signal OUT2 of comparator 24 then is high.

When voltage Vin increases back and reaches threshold Vref3 (time t6), output OUT3 of comparator 25 switches to the low state, which causes the switching to the high state of output QT2 of flip-flop 29 and the starting of the delay of duration T2. At the end of time T2, output QT2 of flip-flop 29 switches to the low state (time t7), causing the reading of the logic combination made by flip-flop 28, and thus the switching to the high state of output Q2, provided that voltage Vin is then still smaller than threshold Vref2.

Functionally, the solution of the present invention amounts to measuring the slope, for example, increasing, of voltage Vin to take into account a zero crossing of the variable voltage only if it is not a bounce or a microfailure. In the presence of a mains filter, its capacitor will discharge into capacitor Cf upon occurrence of a microfailure.

If the slope of voltage Vin (derivative) is smaller than a minimum value, this means the possible discharge of a capacitance of a mains filter, which damps a disappearing (microfailure) of voltage Vac. However, if this derivative is greater than a maximum value, this means the presence of bounces.

The minimum and maximum values are, for example, determined as follows. Noting V0 the voltage across the capacitor of the mains filter, U1 the output voltage (voltage across capacitor Cf), dU1 the tolerated decrease in voltage U1 (which depends on the charge), $\tau$ the operating time desired to save possible digital data (hold-on time), and $\eta$ the output of the power converter (PWC), the minimum value of derivative dVin/dt is given by the following relation:

$(dVin/dt)min = V0 \cdot \eta \cdot [U1^2 - (U1-dU1)^2] / 2 \cdot \pi \cdot (U1-dU1)^2$;

and its maximum value is provided by relation:

$(dVin/dt)max = 2 \cdot Vinmax \cdot \pi \cdot f$, where Vinmax represents the maximum value of voltage Vac, and f represents its frequency.

These determinations enable deducing time constants T1 and T2 and voltage thresholds VHH, Vref2, VHL, and Vref3.

Figure 8:
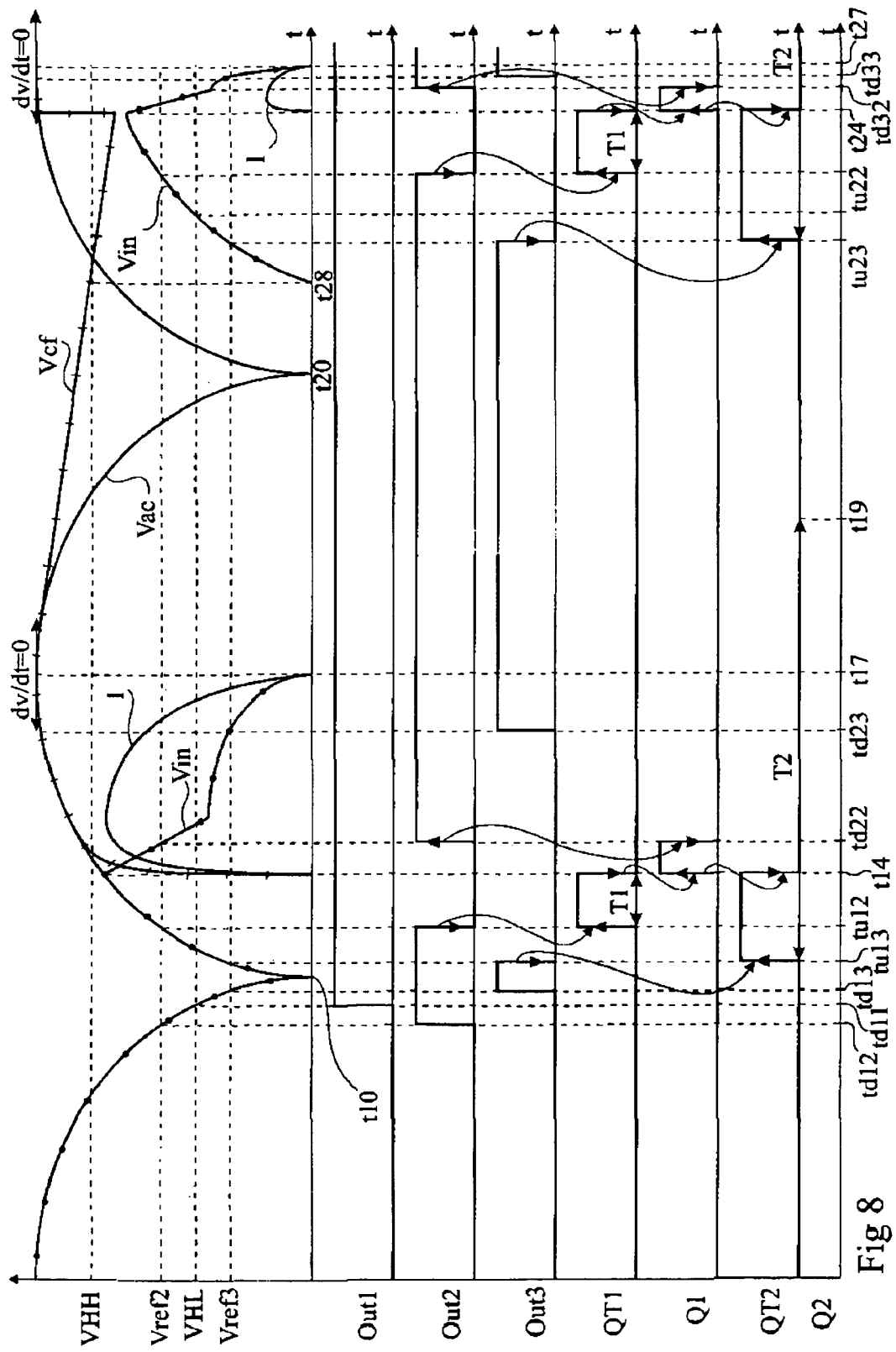
FIGS. 8, 9, and 10 are timing diagrams illustrating the operation of an embodiment of a detector of the present invention in different conditions.
Figure 9:
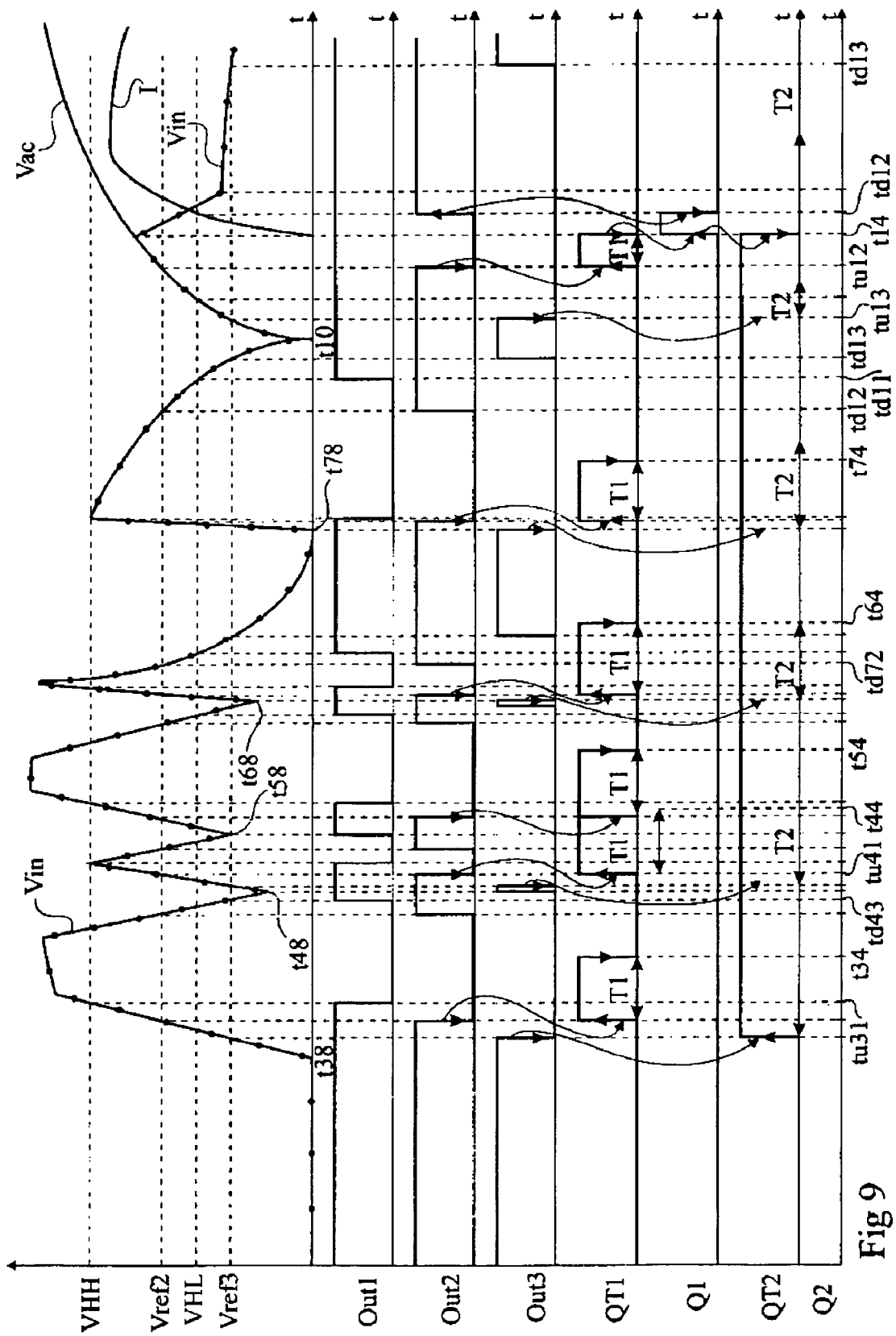
Figure 10:
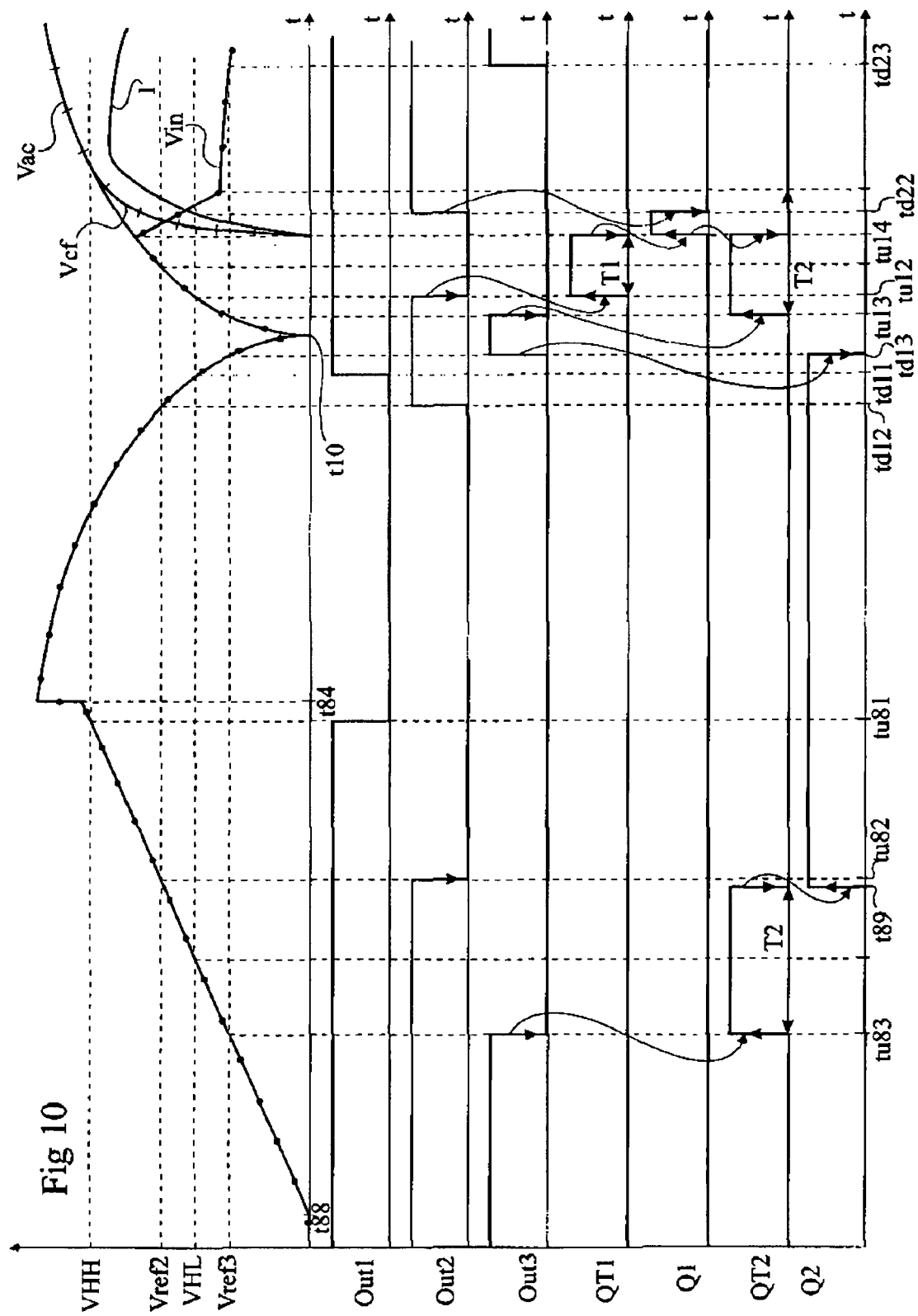

FIGS. 8, 9, and 10 illustrate, in timing diagrams, an example of operation of the detector according to an embodiment of the present invention in different situations. In each of these drawings, the first timing diagram represents the shapes of voltage Vin, of voltage VCf across capacitor Cf, (except for FIG. 9), of voltage Vac (in absolute value), and of current I in the rectifying bridge. The other timing diagrams represent the respective shapes of signals OUT1, OUT2, OUT3, QT1, Q1, QT2, and Q2. To simplify the discussion, no account will be taken of the reduction in voltage Vin with respect to voltage Vac, performed by bridge R10–R11, nor will account be taken of the voltage drops in the different diodes of the assembly.

By convention, the times when the thresholds are crossed by an increasing voltage will be designated as tu, and the times when the thresholds are crossed by a decreasing voltage will be designated as td. Similarly, the crossings at different halfwaves or peaks will be designated with the same unit but with a different decade.

FIG. 8 illustrates the operation in normal state, that is, with no microfailure or bounce.

Capacitor Cf is assumed to be initially discharged (Vcf=0) so that the shapes of voltages Vac and Vin are identical at the beginning. Initially, all logic signals (OUT1, OUT2, OUT3, QT1, Q1, QT2, and Q2) are in the low state. Towards the end of the halfwave during which the powering-on has occurred, voltage Vac, and thus Vin, decreases back. As soon as voltage Vin reaches threshold Vref2 (time td12) in its decrease, signal OUT2 switches high. Then (time td11), when voltage Vin reaches threshold VHL, signal OUT1 switches high. Then (time td13), when voltage Vin reaches threshold Vref3, signal OUT3 switches high. When voltage Vin rises back after the zero crossing (time t10) of voltage Vac (and thus, here, of voltage Vin), signal OUT3 switches low (time tu13) initializing delay T2 (signal QT2), signal OUT2 switches low (time tu13), initializing delay T1 (signal QT1). At the end of time T1 (time t14), voltage Vin has not reached threshold VHH yet. Accordingly, output Q1 switches high, which turns on one of thyristors Th1 and Th2 of the bridge (that which is further properly biased according to the ongoing halfwave of voltage Vac). Current I starts increasing and the charge of capacitor Cf (voltage Vcf) starts. Voltage Vin representing the difference between voltages Vcf and rectified voltage Vac decreases. The switching of signal Q1 also causes the reset of delay circuit 29 before expiration (time t19) of period T2.

The decrease in voltage Vin from time t14 causes the high switching of signal OUT2 (time td22), which resets flip-flop 26 (signal Q1), then the high switching of signal OUT3 (time td23), and thus prepares the detection circuit for the next halfwave.

The bridge conduction carries on to the top of the current halfwave (time t17) where the thyristor Th1 or Th2. which was on is blocked by the disappearing of current I flowing therethrough. From this time on, voltage Vin becomes zero and voltage Vcf stops following rectified voltage Vac, which decreases down to zero (time t20).

In the next halfwave, voltage Vin starts increasing again from the time (time t28) when voltage Vcf becomes smaller than voltage Vac (in the preceding halfwave, times t10 and t18 are confounded). The operation described for times tu13, tu12, t14, td22, td23, and t17 is repeated for times tu23, tu22, t24, td32, td33, and t27. The difference is that the intervals between times are different (except for duration T1 between times tu22 and t24) since voltage Vcf does not start from zero. The system then is in steady state.

FIG. 9 illustrates the operation in the presence of bounces on turning-on of a power-on switch (7, FIG. 3). As in FIG. 8, capacitor Cf is assumed to be initially discharged so that voltage Vin corresponds to voltage Vac always considered as rectified.

In the first halfwave of voltage Vac shown in the drawing, bounces are present in voltage Vin. It can be seen that at the first bounce which starts at a time t38, the bridge conduction is prevented by the fact that at time t34 of switching of output QT1 to the low state, output OUT1 has already returned to the low state since threshold VHH has been reached (time tu31). The second bounce starts (time t48) while the first bounce has passed under threshold Vref3 (time td43) and has reset the system. Voltage Vin reaches (time tu41) threshold VHH before expiration of time T1 (time t44). Further, a third bounce (time t58) appears before expiration of this time T1. Accordingly, two periods T1 overlap, under the effect of the resetting of circuit 27 by the falling edge on its input NCK. At the fourth bounce (time t68), at time t64 of expiration of duration T1, signal OUT1 has returned to the high state. However, since signal OUT2 has also returned to the high state (time td72) due to the rapidity of the decrease, the bridge remains blocked. It is assumed that the switch correctly turns on from time t78 towards the end of the halfwave. The decrease in voltage Vac enables successively initializing signals OUT2 (time td12), OUT1 (time td11), and OUT3 (time td13) at the high state before the end of the halfwave (time t10).

In the second halfwave (from time t10) of voltage Vac, the starting operation described in relation with FIG. 8 (times tu13, tu12, t14, td22, td23, and t17) is repeated. Although shown to be shorter, duration T1 is the same as in the left-hand portion of the timing diagrams.

FIG. 10 illustrates the operation in the presence of a microfailure in the power supply, that is, of the disappearing of voltage Vac while capacitor Vcf is charged. In the representation of FIG. 10, the presence of a mains filter is assumed upstream of terminals 8 and 9. Its capacitor will thus discharge into capacitor Cf until voltage Vac reappears. This phenomenon is illustrated by a rectilinear slope between times t88 and t84, the microfailure being supposed to disappear at time t84. Voltages Vin and Vcf are identical as long as the microfailure has not disappeared. Further, from time t84, the two voltages Vac and Vin have the same shape.

Before the microfailure, signals OUT1, OUT2, and OUT3 all are in the high state since the system has already started. In the discharge of the mains filter, thresholds Vref3, Vref2, and VHL are successively reached at times tu83, tu82, and tu81. However, when output OUT2 switches to the low state (time tu82), delay T1 is not activated since delay T2 has already expired at a time t89. Accordingly, the bridge is not closed. Duration T2 is selected according to the minimum value (dVin/dt)min.

From time t84, a restarting operation such as described in relation with FIG. 8 with times td2, td11, td13, tu13, tu12, t14, td22, etc. can be observed. It can thus be seen that even by considering that the charge of capacitor Cf is maintained by a discharge of a mains filter capacitor, the bridge is not turned on before time t14.

An advantage of the present invention is that it enables control of a rectifying bridge by detection of the zero crossings across its switching elements while managing the microfailures and the possible bounces of a control switch.

Another advantage of the present invention is that the detection circuit is more easily integrable since it has no high-voltage components. The circuit is of reduced cost.

The different circuit elements and especially the thresholds must be sized according to the application by taking into account the load to be supplied.

This determination is within the abilities of those skilled in the art based on the functional indications given hereabove adapted to the application.

As a specific example of embodiment, the different thresholds and delay can take, for an application to the 110V–60 Hz and 220V–50 Hz distribution networks, the following approximate values:

VHH=7.5 volts;
Vref2=3 volts;
VHL=2 volts;
Vref3=1 volt;
T1=30 µs; and
T2=400 µs.

With these values, the minimum value (dVin/dt)min is equal to (Vref2−Vref1)/T2, that is, 0.005 V/µs and the maximum value (dVin/dt)max is equal to (VHH−Vref2)/T1, that is, 0.15 V/µs.

Of course, the present invention is likely to have various alterations, modifications, and improvements which will readily occur to those skilled in the art. In particular, although the present invention has been described in relation with digital flip-flops and comparators, any other equivalent comparison and starting means may be used. Further, although the present invention has been described in relation with an example in which the increasing slope of voltage Vin is measured, it also applies to the measurement of the decreasing slope of the voltage (for example, according to the considered biasing).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for detecting a zero crossing of a variable voltage across at least one switching element, comprising:
   first means of hysteresis comparison of the voltage across the switching element with two first respectively high and low values according to whether the voltage increases or decreases;
   second means for comparing the voltage across the switching element with a second value ranging between the first two thresholds;
   third means for comparing the voltage across the switching element with a third value smaller than the first low value; and
   a logic analysis element of the results of said means for comparing having an output providing the zero crossing detection result if the slope of said voltage is comprised within a range of values.

2. The circuit of claim 1, wherein a slope measurement is initialized by the passing under at least one value by a decrease in said voltage.

3. The circuit of claim 1, wherein the logic analysis element comprises:
   first controllable means of XOR-type combination of the results of the first two comparison means;
   second controllable means of XOR-type combination of the results of the last two comparison means; and
   two delay means of fixed time constants, triggered either by the respective crossings of the second and third values by a decrease in the voltage either by an edge in a given direction of the second and third comparison means, respectively, and for respectively controlling the first and second combination means, the result of the detection being provided by the output of the first combination means.

4. The circuit of claim 3, wherein:
   the first delay means are reset by an active output of the second combination means; and
   the second delay means are reset by an active output of the first combination means.

5. The circuit of claim 4, wherein the combination and delay means are formed of flip-flops.

6. A method for detecting a zero crossing of a variable voltage across at least one switching element, comprising:
   comparing the voltage across the switching element with two first respectively high and low values according to whether the voltage increases or decreases;
   comparing the voltage across the switching element with a second value ranging between the first two thresholds;
   comparing the voltage across the switching element with a third value smaller than the first low value; and
   analyzing with a logic the results of said former comparisons for providing the zero crossing detection result.

7. A circuit for detecting a zero crossing of a variable voltage across at least one switching element, comprising:
   a first hysteresis comparison circuit that compares the voltage across the switching element with two first respectively high and low values according to whether the voltage increases or decreases;
   a second comparison circuit that compares the voltage across the switching element with a second value ranging between the first two thresholds;

a third comparison circuit that compares the voltage across the switching element with a third value smaller than the first low value; and a logic circuit, responsive to the first hystersis comparison circuit, the second comparison circuit, and the third comparison circuit that provides a zero crossing detection result if the slope of said voltage is comprised within a range of values.

8. The circuit of claim 7, wherein a slope measurement is initialized by the passing under at least one value by a decrease in said voltage.

9. The circuit of claim 7, wherein the logic analysis circuit comprises:
   a first controllable XOR-type combination circuit of the results of the first hysteresis comparison circuit and the second comparison circuit;
   a second controllable XOR-type combination circuit of the results of the second comparison circuit and the third comparison circuit; and
   two delay circuits having fixed time constants, triggered either by the respective crossings of the second and third values by a decrease in the voltage either by an edge in a given direction of the second and third comparison circuits, respectively, and for respectively controlling the first and second XOR-type combination circuits, the result of the detection being provided by the output of the first XOR-type combination circuit.

10. The circuit of claim 9, wherein:

one of the delay circuits are reset by an active output of the second combination means; and another of the delay circuits are reset by an active output of the first combination means.

11. The circuit of claim 10, wherein the combination and delay circuits are formed of flip-flops.

* * * * *

UNITED STATES PATENT AND TRADEMARK OFFICE
CERTIFICATE OF CORRECTION

PATENT NO. : 7,236,383 B2  
APPLICATION NO. : 11/254020  
DATED : June 26, 2007  
INVENTOR(S) : Benoît Peron Page 1 of 1

It is certified that error appears in the above-identified patent and that said Letters Patent is hereby corrected as shown below:

Col. 7, line 26, should read:

--$(dVin/dt)min = V0.\eta.[U1^2-(U1-dU1)^2]/2.\tau(U1-dU1)^2;$--

Signed and Sealed this

Fourteenth Day of August, 2007

JON W. DUDAS  
*Director of the United States Patent and Trademark Office*